(12) United States Patent
Shannon et al.

(10) Patent No.: US 7,763,938 B2
(45) Date of Patent: Jul. 27, 2010

(54) FIELD EFFECT TRANSISTOR

(75) Inventors: John M. Shannon, Whyteleafe (GB); Edmund G. Gerstner, Cambridge (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 908 days.

(21) Appl. No.: 10/523,727

(22) PCT Filed: Jul. 29, 2003

(86) PCT No.: PCT/IB03/03352

§ 371 (c)(1),
(2), (4) Date: Sep. 7, 2006

(87) PCT Pub. No.: WO2004/015780

PCT Pub. Date: Feb. 19, 2004

(65) Prior Publication Data

US 2007/0131975 A1   Jun. 14, 2007

(30) Foreign Application Priority Data

Aug. 7, 2002 (GB) .................................. 0218302.8
Jul. 7, 2003 (GB) .................................. 0315819.3

(51) Int. Cl.
*H01L 29/47* (2006.01)

(52) U.S. Cl. ................ 257/341; 257/343; 257/471; 257/E29.271; 257/E29.311; 257/E29.131

(58) Field of Classification Search ................ 257/223, 257/57, 66, E29.131, 341, 343, E29.271, 257/E29.311
See application file for complete search history.

(56) References Cited

U.S. PATENT DOCUMENTS

| | | | | |
|---|---|---|---|---|
| 4,586,240 A * | 5/1986 | Blackstone et al. | ......... | 438/269 |
| 5,578,513 A * | 11/1996 | Maegawa | ..................... | 438/151 |
| 5,580,802 A * | 12/1996 | Mayer et al. | ................. | 438/157 |
| 5,801,398 A * | 9/1998 | Hebiguchi | .................... | 257/66 |
| 6,909,143 B2 * | 6/2005 | Jeon et al. | .................... | 257/335 |
| 7,023,030 B2 * | 4/2006 | Augusto | ..................... | 257/192 |
| 7,242,041 B2 * | 7/2007 | Bucher et al. | ............... | 257/289 |
| 7,420,247 B2 * | 9/2008 | Xu et al. | ..................... | 257/343 |

* cited by examiner

Primary Examiner—Kenneth A Parker
Assistant Examiner—Jose R Diaz

(57) ABSTRACT

A transistor has a source electrode (22) on the opposite side of a semiconductor body layer (10) to a gate electrode (4) insulated from the body layer (10) by gate insulator (8). The source electrode (22) has a potential barrier to the semiconductor body layer (10), for example a Schottky barrier. At least one drain electrode (54) is also connected to the semiconductor body layer (10). A suitable source-drain voltage and gate voltage depletes the region of the semiconductor body layer adjacent to the source electrode (22), and then source-drain current is controlled by the gate voltage.

27 Claims, 13 Drawing Sheets

FIELD EFFECT TRANSISTOR

DESCRIPTION

The invention relates to a transistor, particularly to an insulated gate transistor structure, to a method of manufacturing such a transistor and to the use of the transistor.

Thin film transistors (TFTs) have an active channel in a thin film of semiconductor, generally of amorphous silicon, although other materials such as poly-silicon, and organic semiconductors may also be used. Contacts are made to both ends of the thin film semiconductor channel, and a gate is provided spaced from an intermediate region of the channel by a thin insulating layer. Voltage applied to the gate controls conduction in the channel and saturation in the channel occurs when the channel pinches off at the drain.

TFTs are known either with the gate underneath the channel, known as bottom-gated TFTs, or above the channel, top-gated TFTs.

A particular application of TFTs is their use in active matrix displays, including the active plates of liquid crystal displays and also including arrays of organic light emitting diodes. An array of pixel components may be formed on a substrate, for example of glass, to form the display or the active plate of a display, and one or more thin film transistors provided at each pixel of the display.

However, the properties of thin film transistors are not ideal for every application.

Conventional FETs are also known using a semiconductor body but again the properties of such FETs are not ideal in every case.

There thus remains a need for an alternative transistor structure.

According to the invention there is provided an insulated gate transistor that is different in structure and in operation from TFTs. Important structural and operational features of such novel transistors in accordance with the invention are set out in the appended Claims.

In a first aspect, there is provided an insulated gate transistor for conduction using charge carriers of a predetermined conductivity type, comprising: a semiconductor body layer;

a source electrode extending across a source region of the semiconductor body layer defining a Schottky potential barrier between the source electrode and the source region of the semiconductor body layer;

a drain electrode connected to the semiconductor body layer; and a gate electrode for controlling transport of carriers of the predetermined carrier type from the source electrode to the source region of the semiconductor body layer across the barrier when the source region is depleted;

wherein the gate electrode is arranged in an overlapping relationship to the source electrode on the opposite side of the semiconductor body layer to the source electrode having a gate insulator layer between the gate electrode and the semiconductor body layer; and the gate electrode is spaced from the source electrode by at least the combined full thickness of the semiconductor body layer and the gate insulator over the whole of the gate-controlled region of the Schottky barrier.

In another aspect, there is provided an insulated gate transistor for conduction using charge carriers of a predetermined conductivity type, comprising:

a semiconductor body layer having a thickness of at least 10 nm;

a source electrode extending across a source region of the semiconductor body layer defining a potential barrier between the source electrode and a source region of the semiconductor body layer, a drain electrode connected to the semiconductor body layer; and a gate electrode for controlling transport of carriers of the predetermined carrier type from the source electrode to the source region of the semiconductor body layer across the barrier when the source region is depleted;

wherein the gate electrode is arranged in an overlapping relationship to the source electrode on the opposite side of the semiconductor body layer to the source electrode having a gate insulator layer between the gate electrode and the semiconductor body layer; and the gate electrode is spaced from the source electrode by at least the combined thickness of the full thickness of the semiconductor body layer and the gate insulator over the whole of the gate-controlled region of the source barrier.

Transistors in accordance with the invention are based on a principle of locating the source electrode opposite the gate electrode, the two sandwiching a source barrier, semiconductor body layer and the gate insulating layer so that the current from source to body is controlled by the transmission of carriers across the barrier. The current is thus largely determined by the source-gate voltage and is only weakly dependent on the drain voltage. The transistor according to the invention will thus be referred to as a "source gated transistor" (SGT) in the following.

The SGT has a high output impedance and a low pinch off voltage compared with a standard thin film transistor (TFT). The low pinch-off voltage allows it to be operated with a low drain voltage and consequent low power dissipation.

A further difference is that the SGT should in general preserve its characteristics at smaller dimensions than a FET. This means that it is useful for high speed or small analogue circuits, among many other applications.

A major difference between an SGT and a TFT is that in a TFT the current saturates when pinch-off occurs at the drain and its magnitude is determined by the distribution of carriers and the electric field in the channel whilst for SGTs the channel saturates when pinch-off occurs at the source and its magnitude depends on the magnitude of the electric field at the source barrier. The low pinch-off voltage allows the transistor to operate with a small drain voltage whilst the high output impedance can give good results in many types of circuit, including for example current sources, current mirrors, timing devices, small signal amplifiers and correction circuits.

The thickness of the source body region should preferably be sufficient that the source region acts as a conventional, depletable region. If the source region is too thin, quantum effects may come into play such as sharp energy levels which may give rise to undesirable effects, such as peaks in the response caused by the electron confinement. As the skilled person will appreciate, the minimum thickness will depend on the materials used, but a preferred thickness of at least 10 nm, in embodiments at least 15 nm or even 20 nm, is generally sufficient.

In preferred embodiments, the semiconductor body layer is the sole semiconductor layer in the device, doped to provide different source and drain regions. In this way, fabrication of the device is straightforward compared with the multiple semiconductor layers required in conventional devices.

Further, the structure of the SGT is well suited to fabrication in thin film technology, including using amorphous silicon, polysilicon, and organic semiconductors including polymer semiconductors. Thus, the transistor is suitable for use in displays and other technologies that presently use conventional thin film transistors (TFTs). A relevant figure of merit is the voltage gain figure of merit $g_m/g_d$ where $g_m$ is the mutual conductance and $g_d$ the output conductance: the potential voltage gain figure of merit $g_m/g_d$ can be considerably greater than for a conventional amorphous silicon or polysilicon TFT.

The transistor structure should ensure that the predetermined carriers are only caused to enter the semiconductor body layer from the source region across a well-defined barrier controlled by the gate. This is achieved by ensuring that in the region of the body layer controlled by the gate, the source and gate electrodes are spaced apart by barrier layer, semiconductor body layer and gate insulator layer.

To achieve the separation between barrier and gate, in embodiments, the source electrode defines a barrier with the semiconductor body layer, and in the gate controlled region of the barrier, the barrier extends purely on the opposite lateral surface of the semiconductor body layer to the gate electrode.

Schottky barriers have been used in the past for the source and drain contacts to field effect transistors—see Sze—Physics of Semiconductor Devices, 2nd edition, pages 491-492. Other examples are provided in Uchida et al, Applied Physics Letters volume 76 pages 3992 to 3994 (2000) and in US Patent Application US2002/0009833 to Lin et al. In such devices, the gate controls a channel as in conventional FETs. In contrast, in a device according to the invention the gate is arranged opposite to the source so that the gate voltage controls the source—body barrier height. In general, in the prior art devices, the gate is arranged to control the channel between the source and drain. In such FETs using a Schottky barrier a metal is used that gives a low barrier to current transport when the transistor is switched on so as not to impede the current. A p-channel device for example, requires a small barrier potential for holes, but also a high barrier to electron so that when a negative potential is applied to the gate and the device is switched on the current is not restricted by the contacts, but with a positive potential on the gate, the device is switched off and these are large barriers to electrons, and the leakage current is small.

Another prior example, U.S. Pat. No. 5,801,398 discloses a transistor structure that has a Schottky source electrode in contact with an end (lateral edge) of the semiconductor body layer. In U.S. Pat. No. 5,801,398 carriers from the source electrode do not need to pass through a well defined barrier, but may instead flow into the semiconductor body layer at the end and in effect short the source electrode to the semiconductor body layer. In the device of U.S. Pat. No. 5,801,398 this is intentional; the source is to provide a conventional source contact and the gate controls the channel of the semiconductor device to control carrier transport as in conventional FETs using ohmic contacts.

A convenient implementation of the invention uses a metal as the source layer, the metal forming a Schottky barrier with the semiconductor body layer. The barrier potential is in this case the Schottky barrier potential.

Other benefits of the invention include potentially high voltage gain and power gain, high speed and high voltage operation.

The insensitivity of the source current to the drain voltage allows devices to be made with a short separation between source and drain regions. Thus, the lateral extent of the intermediate region between the drain region and the source region is preferably less than 4 µm. Such short devices decrease the transit time of carriers across the device and increase its speed of operation. Unlike the situation in a conventional TFT, where the drain voltage degrades the output characteristics of short channel devices, the SGT current is not determined by a channel but by the source.

Preferred embodiments provide field relief at the periphery of the source. A variety of suitable field relief structures are known, see for example Sze, Physics of Semiconductor devices, 2nd Edition, page 299.

Accordingly, in an alternative aspect there is provided an insulated gate transistor for conduction using charge carriers of a predetermined conductivity type, comprising: a semiconductor body layer; a source electrode extending across a source region of the semiconductor body layer defining a barrier at the interface between the source electrode and the source region of the semiconductor body layer, a drain electrode extending across and connected to a drain region of the semiconductor body layer, the drain region of the semiconductor body layer being spaced from the source region defining an intermediate region of the semiconductor body layer between the source and drain regions; a gate electrode extending on the opposite side of the semiconductor body layer to the source electrode defining a gate-controlled region of the semiconductor body layer including at least a part of the source region; a gate insulator layer between the gate electrode and the semiconductor body layer; and a field relief structure on the edge of the source region facing the drain region.

One approach to field relief is for the source electrode to extend laterally across at least part of the intermediate region, separated from the intermediate region by an insulating layer. This avoids sharp field changes in the semiconductor body layer at the edge of the source region and thus increases device quality and reliability.

The height of a Schottky barrier at the source may be controlled by a low dose of implanted ions. This technique allows transistors with different operating currents to be formed by varying the height of the barrier. A low energy donor implant reduces the barrier to electrons, and an acceptor implant will increase the barrier to electrons.

A further use of a donor implant is to introduce donors into the intermediate region. Effective field relief at the edge of the source can be obtained by compensation, particularly in devices using hydrogenated amorphous silicon as the semiconductor body layer. For example, if the body is lightly doped n-type, the intermediate region may be provided with p-type doping to make it insulating and to provide field relief at the edge of the source.

The drain electrode may make an ohmic contact to the semiconductor body layer. Alternatively, the drain electrode itself may make a non-ohmic contact to the semiconductor body layer—this latter approach may enable it to be made in the same step as the source electrode.

In embodiments, the transistor includes a pair of drain electrodes and corresponding drain regions laterally on either side of the source region. This increases the current handling capacity since source current can leave the source region to either side of the source region, to either of the pair of drain electrodes.

The transistor according to the invention may be top or bottom gated. Thus, the semiconductor body layer may overlie the source electrode and the gate electrode may overlie the semiconductor body layer, or alternatively the semiconductor body layer may overlie the gate electrode and the source electrode may overlie the semiconductor body layer.

The invention also relates to a transistor circuit having a substrate and a plurality of transistors as set out above. The transistors may be arranged as an array and may include both n-type and p-type transistors.

In preferred embodiments, a shallow implant of donor impurities is provided under the barriers of p-type and n-type transistors to raise the effective barrier height to holes in the p-type transistors and to lower the effective barrier height to electrons in the n-type transistors. Conveniently, the same donor implant type may be used for both n- and p-type transistors.

In another aspect, there is provided an insulated gate transistor for conduction using charge carriers of a predetermined conductivity type, comprising:

a semiconductor body layer formed of a film of amorphous silicon, polysilicon, or organic semiconductor or polymer semiconductor;

a source electrode extending across a source region of the semiconductor body layer defining a potential barrier between the source electrode and a source region of the semiconductor body layer, a drain electrode connected to the semiconductor body layer; and a gate electrode for controlling transport of carriers of the predetermined carrier type from the source electrode to the source region of the semiconductor body layer across the barrier when the source region is depleted;

wherein the gate electrode is arranged in an overlapping relationship to the source electrode on the opposite side of the semiconductor body layer to the source electrode having a gate insulator layer between the gate electrode and the semiconductor body layer; and the gate electrode is spaced from the source electrode by at least the combined thickness of the full thickness of the semiconductor body layer and the gate insulator over the whole of the gate-controlled region of the source barrier.

The invention also relates to a method of manufacturing a transistor as set out above, and to the use of such a transistor.

In another aspect, the invention relates to a method of operating a transistor having a source electrode, a drain electrode, a semiconductor body layer having a source region in contact with the source electrode and a drain region in contact with the drain electrode, and an insulated gate opposed to the source electrode, the method including: applying a voltage between the source, gate and drain to substantially deplete the whole of the source region of the semiconductor body layer and to cause carriers to be emitted by the source electrode across the barrier and across the depleted source region to the drain region and then to the drain electrode.

In a yet further aspect, the invention relates to a transistor circuit, including an insulated gate field effect transistor having a semiconductor body layer, a source electrode and a gate electrode arranged in opposed relationship on opposite sides of the semiconductor body layer, with a barrier between the source electrode and the semiconductor body layer and a gate insulator between the semiconductor body layer and the gate, and a drain electrode connected to the semiconductor body layer; and a circuit arranged to apply voltages to source, gate and drain electrodes to deplete the semiconductor body layer in the region of the source electrode and to control the barrier height of the barrier by the source-gate voltage to control the emission of carriers from the source electrode to the semiconductor body layer and hence to control the source-drain current by the source-gate voltage.

For a better understanding of the invention, embodiments will now be described, purely by way of example, with reference to the accompanying drawings in which.

Figure 10:
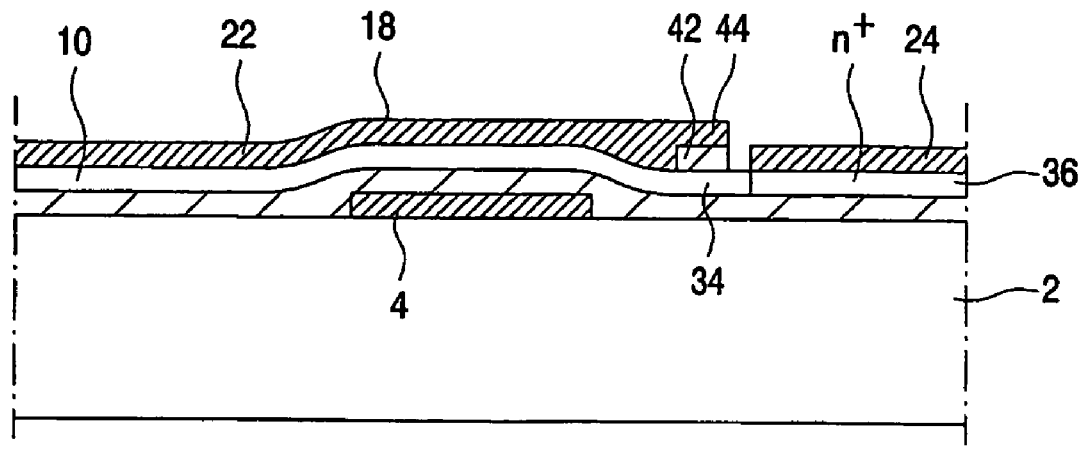
Figure 11:
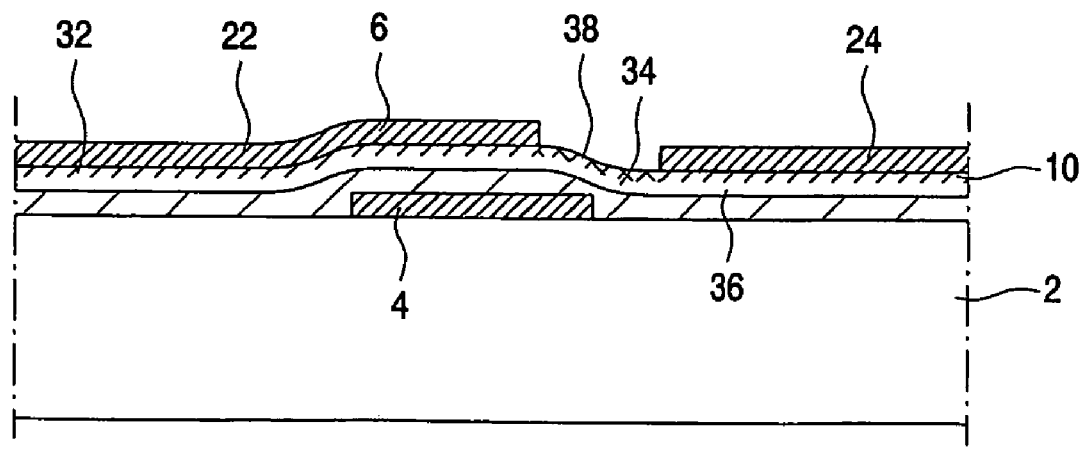
Figure 12:
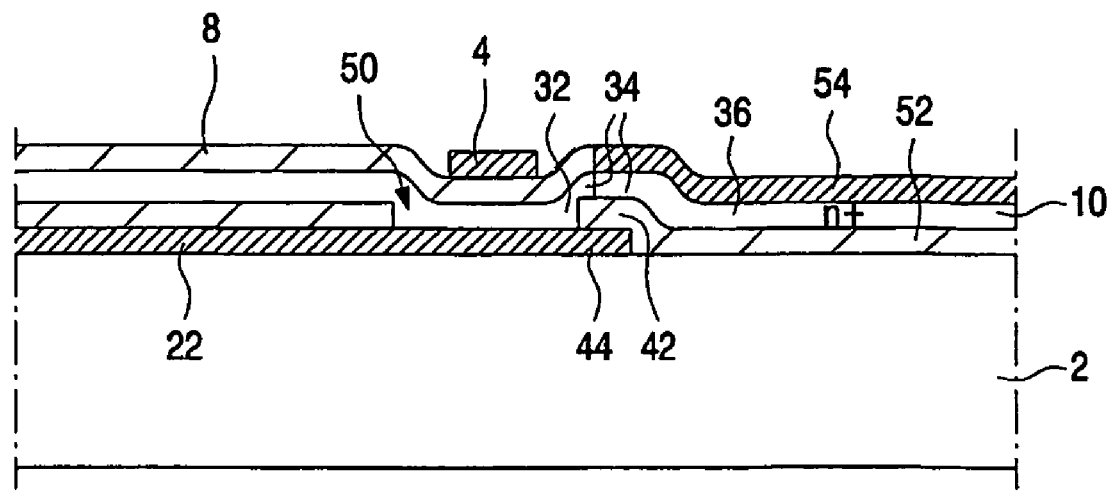
Figure 13:
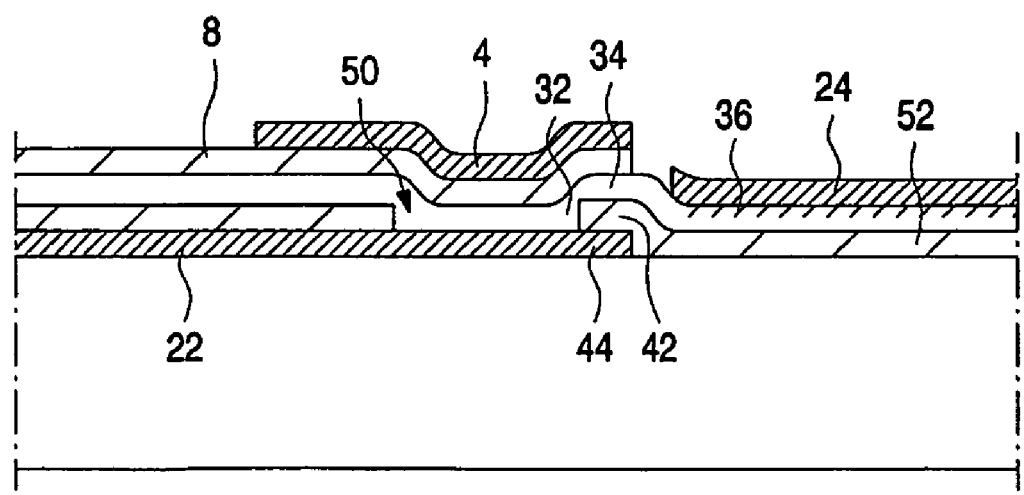
Figure 14:
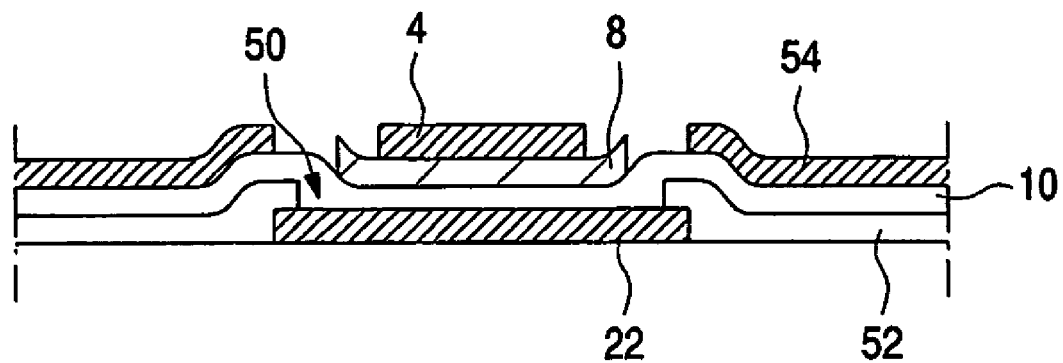
Figure 15:
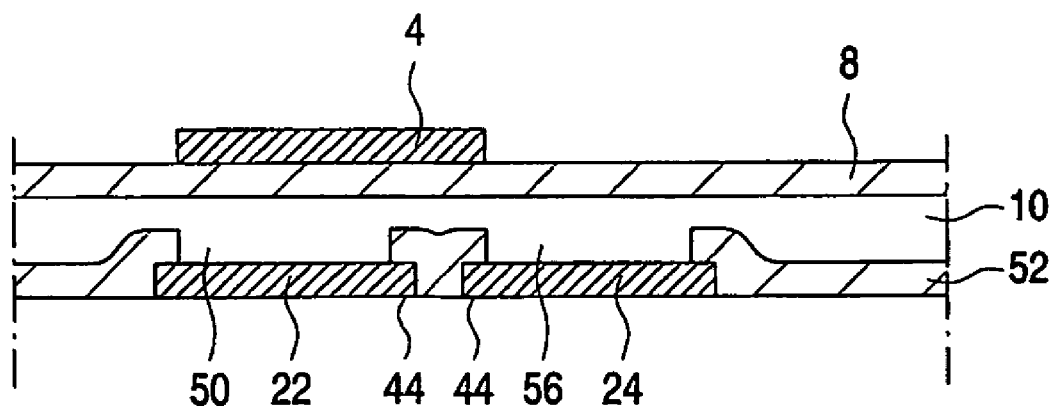
Figure 16:
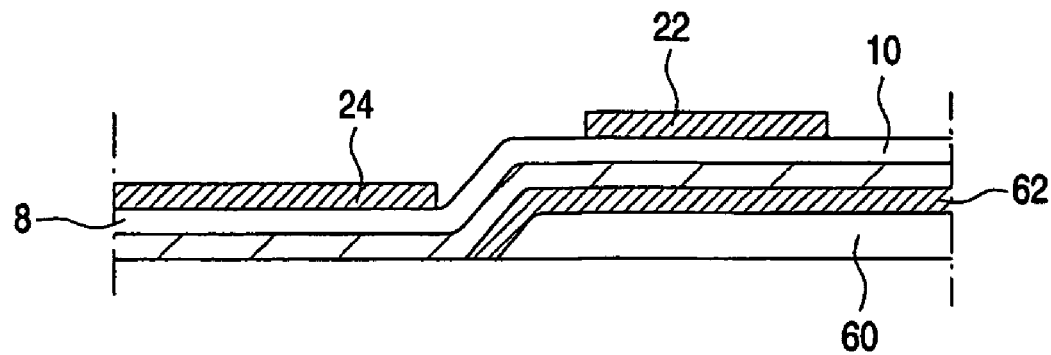
Figure 17:
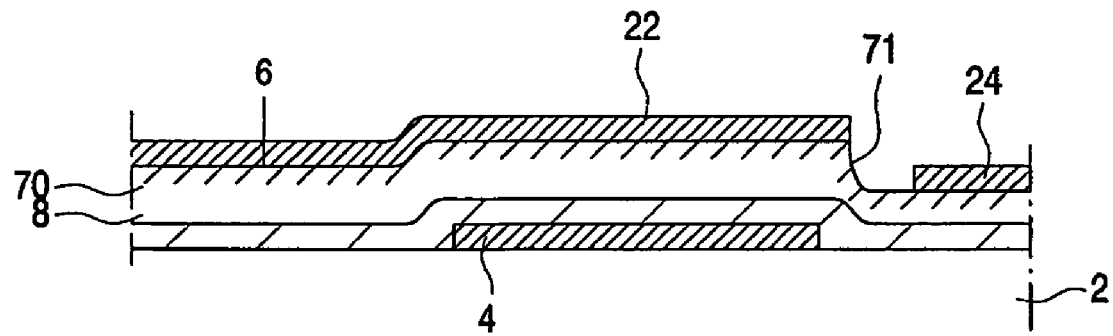
Figure 18:
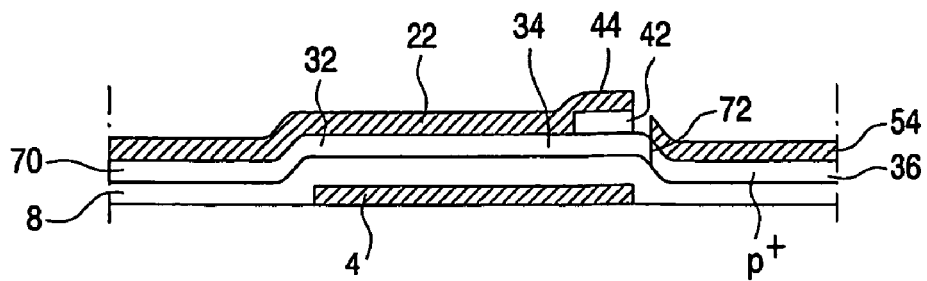
Figure 19:
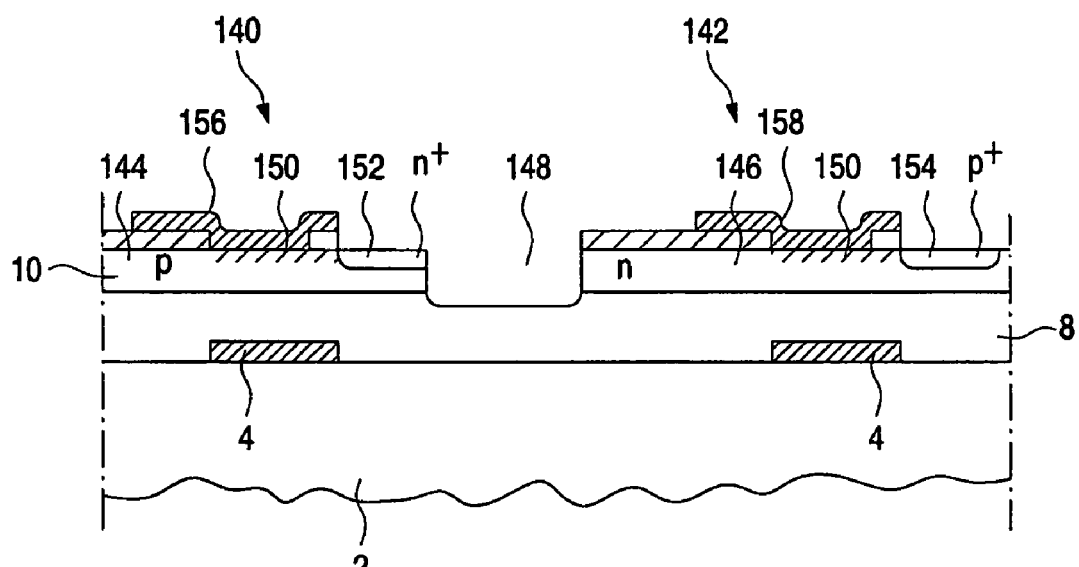
Figure 20:
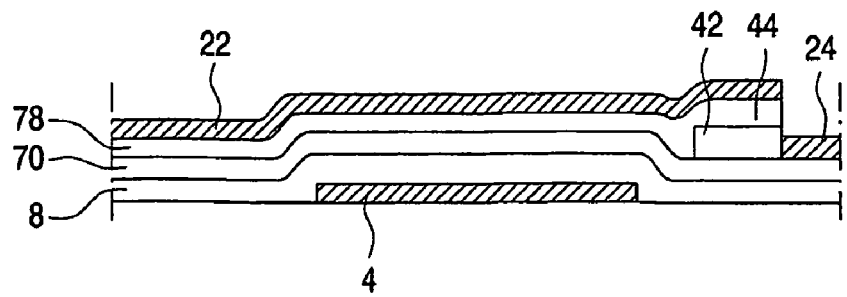
Figure 21:
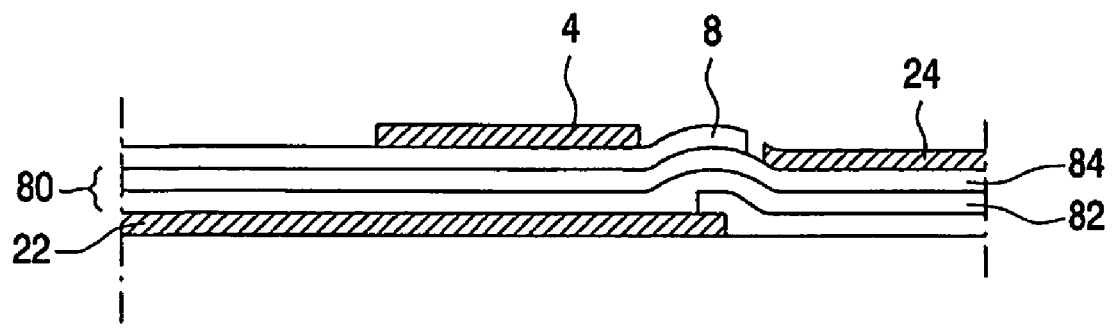
Figure 22:
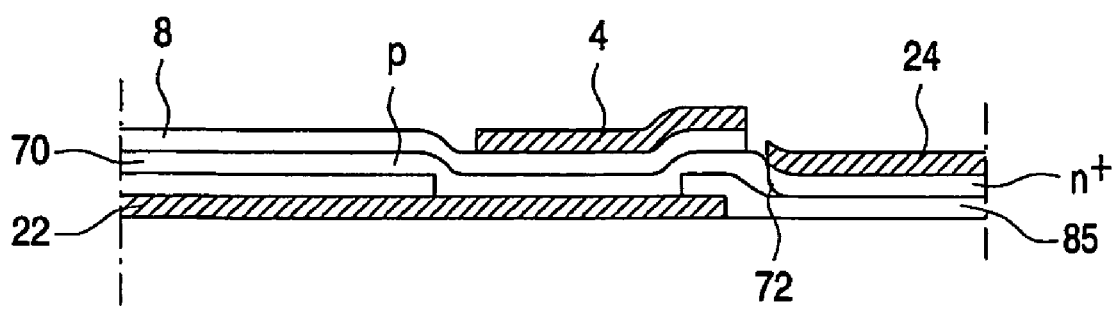
Figure 23:
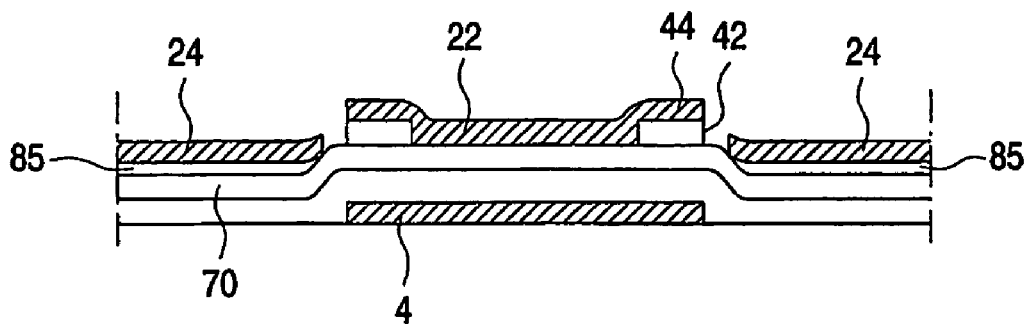
Figure 24:
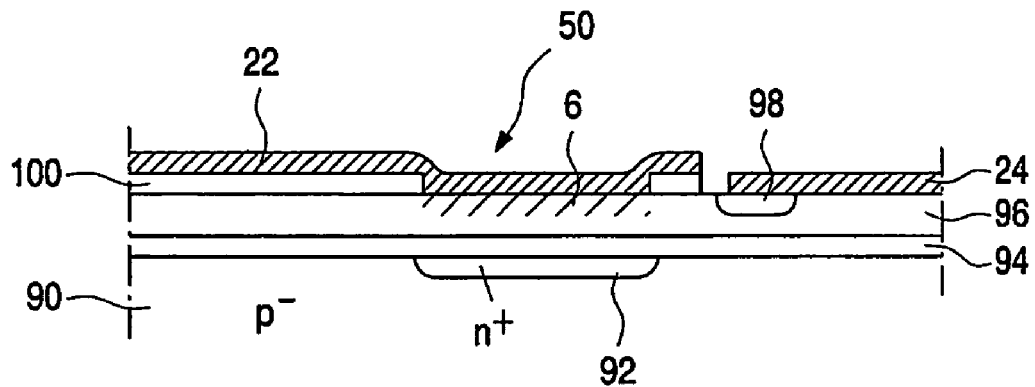
Figure 25:
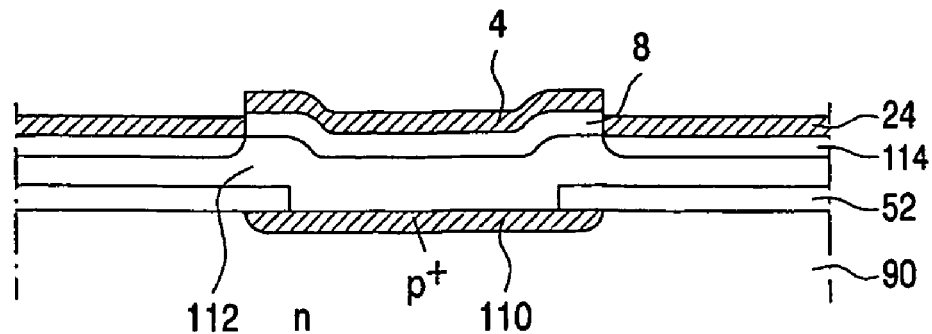
Figure 26:
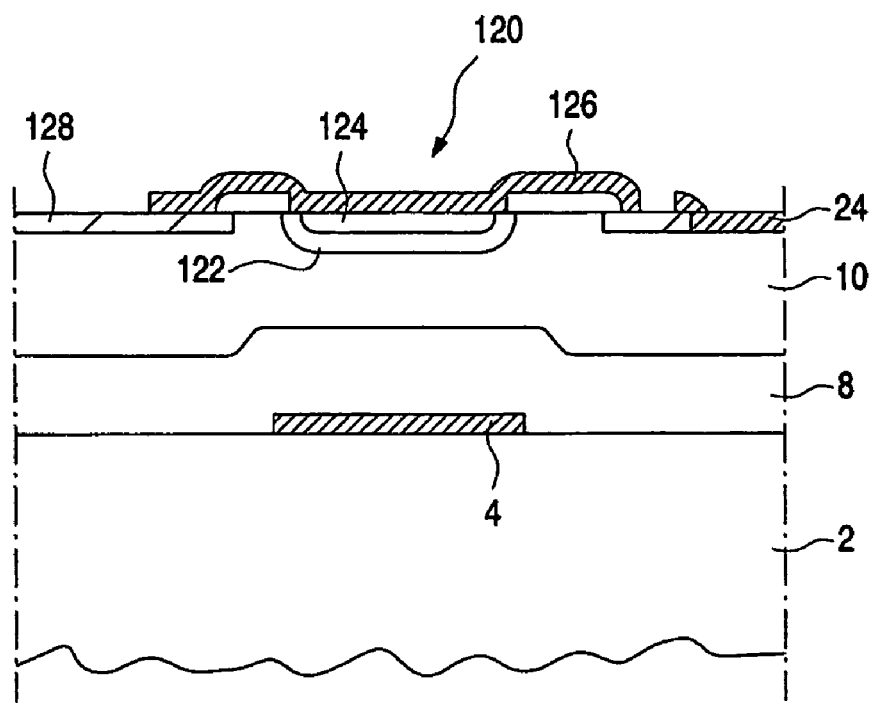
Figure 27:
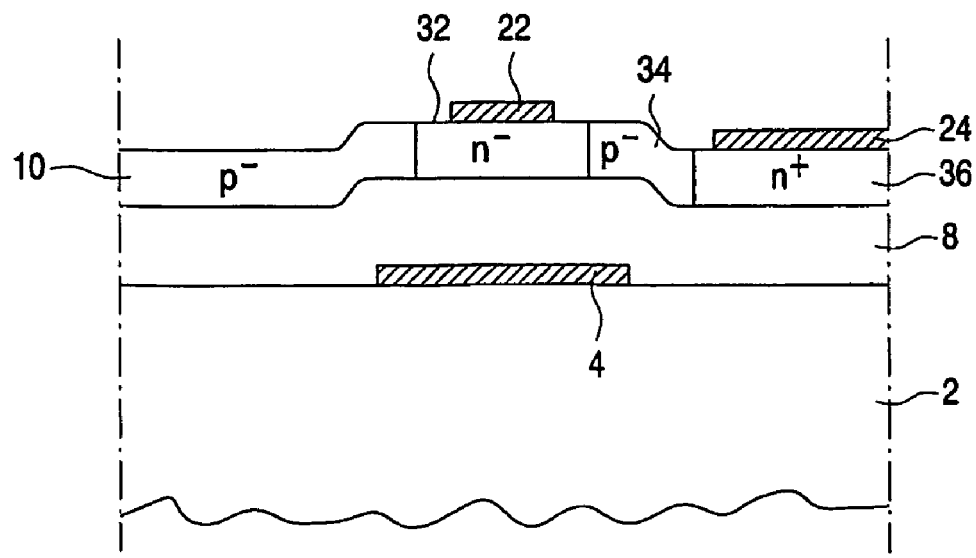
Figure 28:
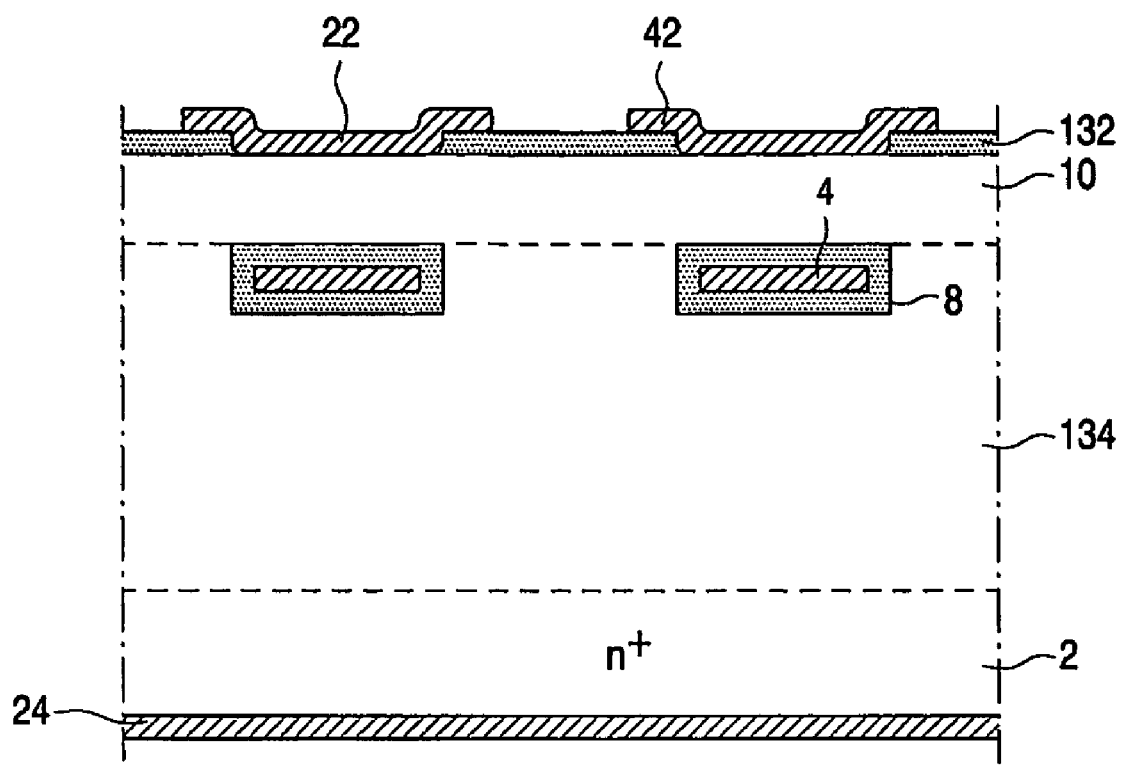

FIG. 10 illustrates a second embodiment of an SGT;
FIG. 11 illustrates a third embodiment of an SGT;
FIG. 12 illustrates a fourth embodiment of an SGT;
FIG. 13 illustrates a fifth embodiment of an SGT;
FIG. 14 illustrates a sixth embodiment of an SGT;
FIG. 15 illustrates a seventh embodiment of an SGT;
FIG. 16 illustrates an eighth embodiment of an SGT;
FIG. 17 illustrates a ninth embodiment of an SGT;
FIG. 18 illustrates a tenth embodiment of an SGT;
FIG. 19 illustrates a eleventh embodiment of an SGT;
FIG. 20 illustrates a twelfth embodiment of an SGT;
FIG. 21 illustrates a thirteenth embodiment of an SGT;
FIG. 22 illustrates a fourteenth embodiment of an SGT;
FIG. 23 illustrates a fifteenth embodiment of an SGT;
FIG. 24 illustrates a sixteenth embodiment of an SGT;
FIG. 25 illustrates a seventeenth embodiment of an SGT;
FIG. 26 illustrates an eighteenth embodiment of an SGT;
FIG. 27 illustrates a nineteenth embodiment of an SGT; and
FIG. 28 illustrates a twentieth embodiment of an SGT.

The figures are purely diagrammatic and not to scale. Like or similar components are given the same reference numerals in different figures.

Figure 1:
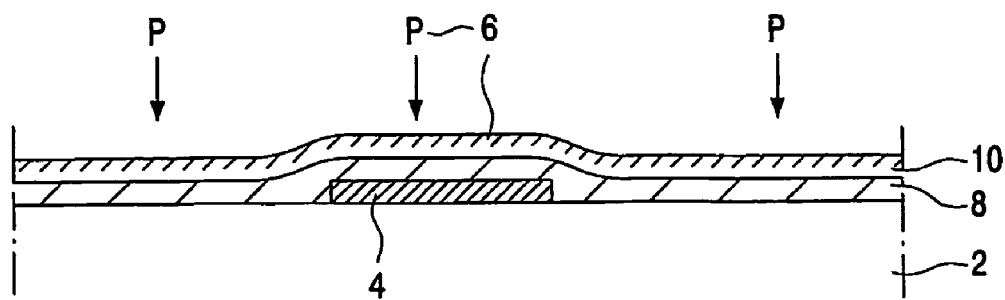
FIG. 1 shows a first step in the manufacture of a first embodiment of an SGT according to the invention.
Figure 2:
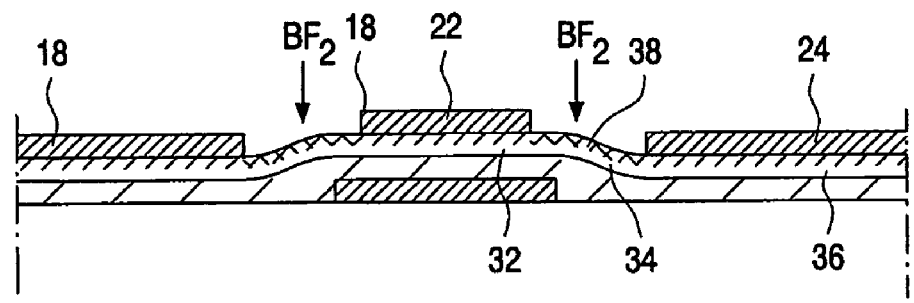
FIG. 2 shows a second step in the manufacture of an SGT according to the invention.

A first embodiment of the invention, its manufacture and properties will now be discussed with reference to FIGS. 1 to 3.

Figure 3:
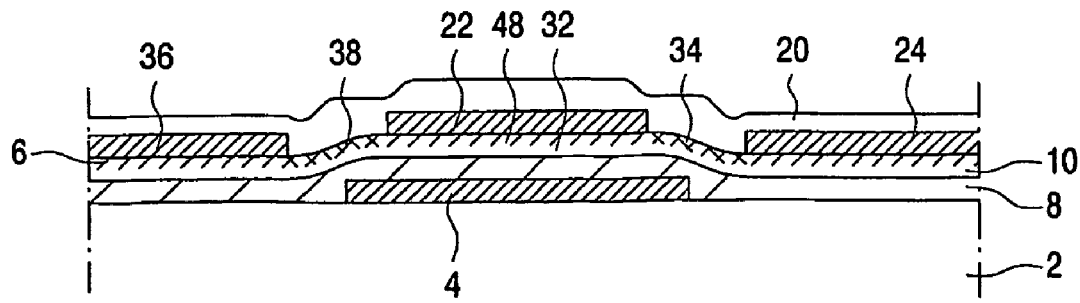
FIG. 3 shows a third step in the manufacture of an SGT according to the invention.

Thus, FIG. 3 illustrates a first embodiment of an n-type conduction SGT, i.e. transistor conduction is using electrons. The transistor is formed on substrate 2. Semiconductor body layer 10, with a source electrode 22 extends laterally across a depletable source region 32 of the semiconductor body layer 10, defining a barrier 48 at the interface between the source electrode 22 and the source region 32 of the semiconductor body layer. A pair of drain electrodes 24 are provided, each extending laterally and being connected to a drain region 36 of the semiconductor body layer. The drain region 36 of the semiconductor body layer is spaced laterally from the source region 32, so defining an intermediate region 34 of the semiconductor body layer between the source and drain regions.

In the present invention the barrier is a Schottky barrier and an implantation 6 is provided in the semiconductor body layer 10 to control the height of this barrier.

On the opposite side of the semiconductor body layer to the source electrode, there is a gate electrode 4 in an overlapping relationship to the source electrode 22 and having a gate insulator layer 8 between the gate electrode 4 and the semiconductor body layer 10. This overlapping insulated gate electrode 4 is coupled to the source barrier 48 only through the thickness of the semiconductor body layer 10 and gate insulator 8 so that, when the source region 32 is depleted, voltage applied to the gate electrode 4 controls transport of carriers of the predetermined carrier type across the barrier 48 from the source electrode 22 to the source region 32 of the semiconductor body layer 10. Passivation layer 20 is provided over the top surface.

Viewed from another perspective, the SGT of FIG. 3 comprises a semiconductor layer 10 that provides a body portion 32,34 of the transistor between a source 22 of the electrons (i.e. the conduction carriers of the predetermined conductivity type of the transistor) and a drain 24,34 for these charge carriers. The insulated gate of the SGT comprises a gate electrode 4 coupled to a region 32 of the body portion 32,34 via an intermediate gate-dielectric layer 8. The source comprises a barrier 48 to the said carriers between a source electrode 22 and the semiconductor layer 10. This barrier 48 inhibits carrier flow from the source 22 into the body portion 32,34 except as controlled by the insulated gate 4,8. The source 22 and the insulated gate 4,8 are located at respective opposite major sides of the semiconductor layer 10 in an opposed laterally-overlapping relationship which separates the source 22 from the insulated gate 4,8 by at least an intermediate thickness of the body portion 32,34 between the opposite major sides of the semiconductor layer 10. The laterally-overlapping insulated gate 4,8 is coupled to the source barrier 48 via this intermediate thickness of the semiconductor layer 10. Upon depletion of the region 32 across the intermediate thickness of the semiconductor layer 10 from the insulated gate 4,8, this coupling permits the voltage applied between the gate and source electrodes 4 and 22 to control transistor conduction by controlled emission of said carriers (for example, by thermionic-field emission) across the source barrier 48.

In order to encourage conduction across the main part of the barrier 48 (i.e. rather than conduction at the barrier edge), it is advantageous for the source barrier 48 to be provided with field-relief at least at the lateral edge of the source barrier 48 facing the drain 24,34. One such field relief measure (using compensation doping) is incorporated in the FIG. 3 embodiment: the compensation doped region 38 provides field relief.

The following process (illustrated in FIGS. 1 to 3) was used to fabricate the FIG. 3 transistor:

A bottom gate 4 was deposited and patterned using a first mask on a glass substrate 2. Then, a 300 nm silicon nitride gate insulation layer 8 and a 150 nm undoped hydrogenated amorphous silicon layer 10 to act as the semiconductor body were deposited using known techniques. A second mask was used to define silicon islands above the gate electrodes. A dose of $1 \times 10^{14}$ cm$^{-2}$ phosphorous 6 was implanted into the surface at 10 KeV to control the source barrier height. This technique is explained in more detail in U.S. Pat. No. 3,943,552 to Shannon et al.

A chromium metal layer 18 was deposited onto the structure and defined using a third mask to define a source electrode 22 and a pair of drain 24 electrodes spaced away from the source electrode 22 on either side of the source electrode 22. A boron difluoride implant 38 of $1 \times 10^{14}$ cm$^{-2}$ at 12 KeV was made using the source 22 and drain 24 electrodes for autoalignment, the boron implant 38 compensating the phosphorous. The boron implant is into the intermediate region 34 of the amorphous silicon layer 10, between the source region 32 in contact with the source 22 and the drain region 36 in contact with the drain. A passivation layer 20 was deposited over the top of the structure. The structure was annealed at 250° C. for 30 minutes to activate the implanted phosphorous and boron.

Further details of the compensation technique used may be found in U.S. Pat. No. 5,047,360 to Nicholas assigned to US Philips Corp.

Any other processing required for other components is then carried out and the device packaged. The skilled person will be aware of many different types of device that may need transistors, including for example the active plate of a liquid crystal display or a light emitting diode display. The transistor may be used in such a display as part of the correction circuit in each pixel. The transistors may also be used as low current amplifiers in imaging arrays.

The chromium of the source 22 and drain 24 electrodes made a Schottky barrier to the amorphous silicon body. The phosphorus doping is used to achieve a suitably low Schottky barrier height for electrons to enable high current operation at low gate voltages. As will be appreciated by the skilled person, the phosphorous doping may be varied to fine-tune the Schottky barrier height and hence the gate voltage needed.

Figure 4:
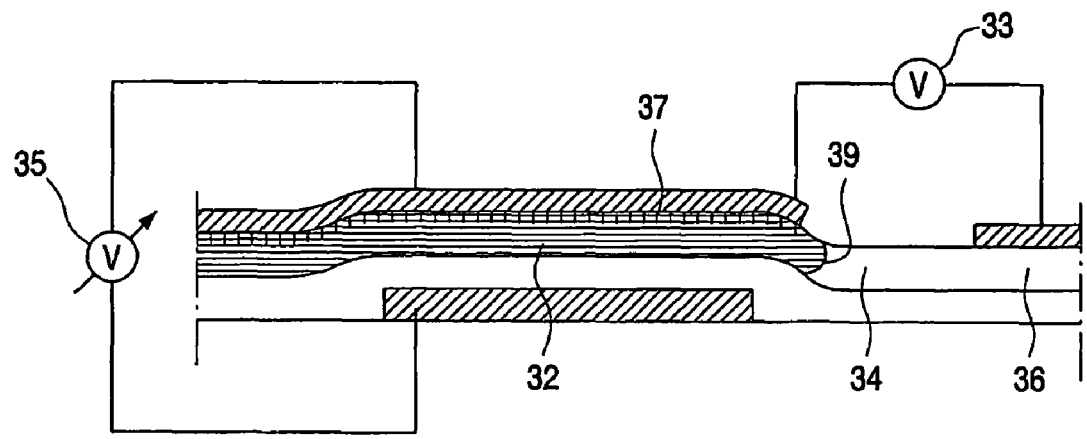
FIG. 4 illustrates depletion in an SGT.
Figure 5:
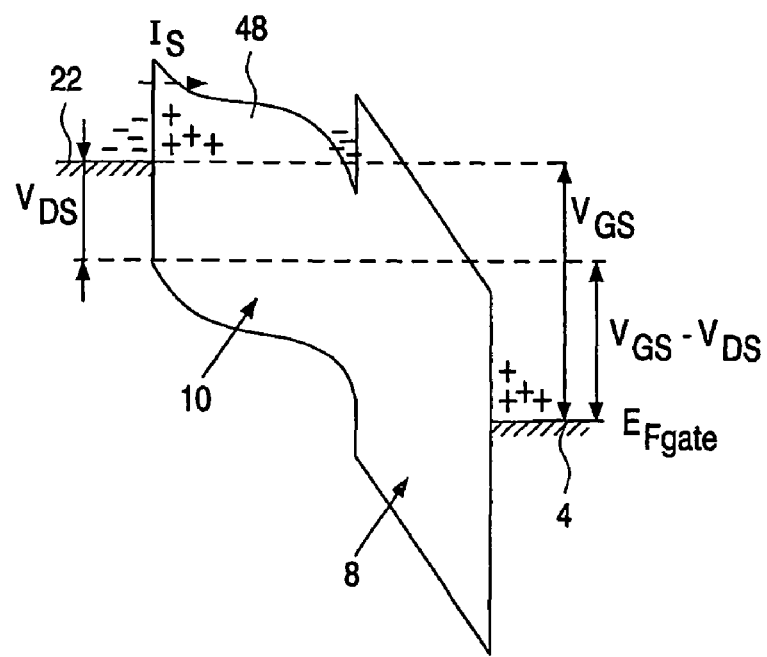
FIG. 5 is a band diagram of an SGT in a condition in which the source region is not depleted.
Figure 6:
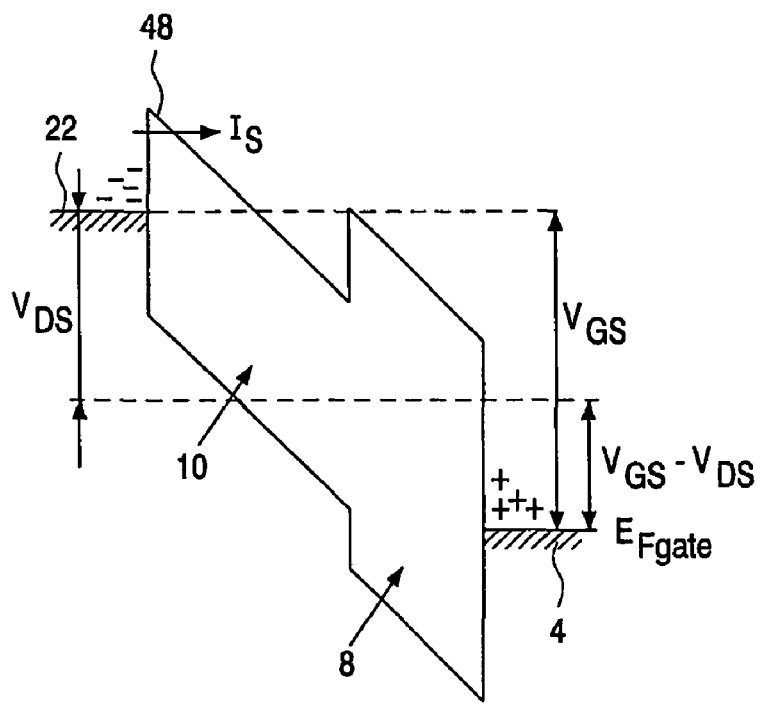
FIG. 6 is a band diagram of an SGT in an operating condition.

FIGS. 4, 5 and 6 illustrate the mechanism of the SGT.

FIG. 4 shows the depletion region in the source region 32 adjacent to the source at two different drain source voltages. First depletion region 37 (shown with vertical shade lines) is the depletion region for a low magnitude drain-source voltage insufficient to deplete the whole thickness of the source region 32. Second depletion region 39 (shown with horizontal shade lines) shows the depletion region for a higher magnitude drain-source voltage sufficient to wholly deplete the full thickness of the source region 32, a dn to extend a little way into intermediate region 34 towards drain region 36.

FIG. 4 also schematically illustrates voltage source 33 for maintaining the source-drain voltage and voltage source 35 for maintaining the source-gate voltage. The voltage source 33 supplies sufficient voltage to fully deplete the source region, and voltage source 35 applies a variable voltage to control the source-drain current.

FIG. 5 is a band diagram for the partially depleted case and FIG. 6 is a corresponding band diagram for the saturated, fully depleted case. In each case, the band diagram shows the bands between source and gate i.e. in the source electrode 22, semiconductor body layer 10, gate insulator 8 and gate 4, together with the drain voltage which is also indicated. As will be appreciated by the skilled person, sufficient drain voltage for pinch-off depletes the whole source region (FIG. 6) and in this condition the effect of an increase in gate voltage will be to reduce the effective height of barrier 48 at the Schottky source by increasing the electric field at the metal-semiconductor interface. This increases the current across the barrier.

In an SGT there may be a significant capacitance between drain and gate $C_{GD}$. For this reason, in practical devices the gap between source and drain is preferably reduced. Since in the operating condition the distance between the depleted region and the drain region is not important, this region can be made short in SGTs without significantly affecting performance. For example, the intermediate region between source and drain may have a lateral extent less than 5 µm, preferably in the range 0.5 µm to 2.5 µm.

Figure 7:
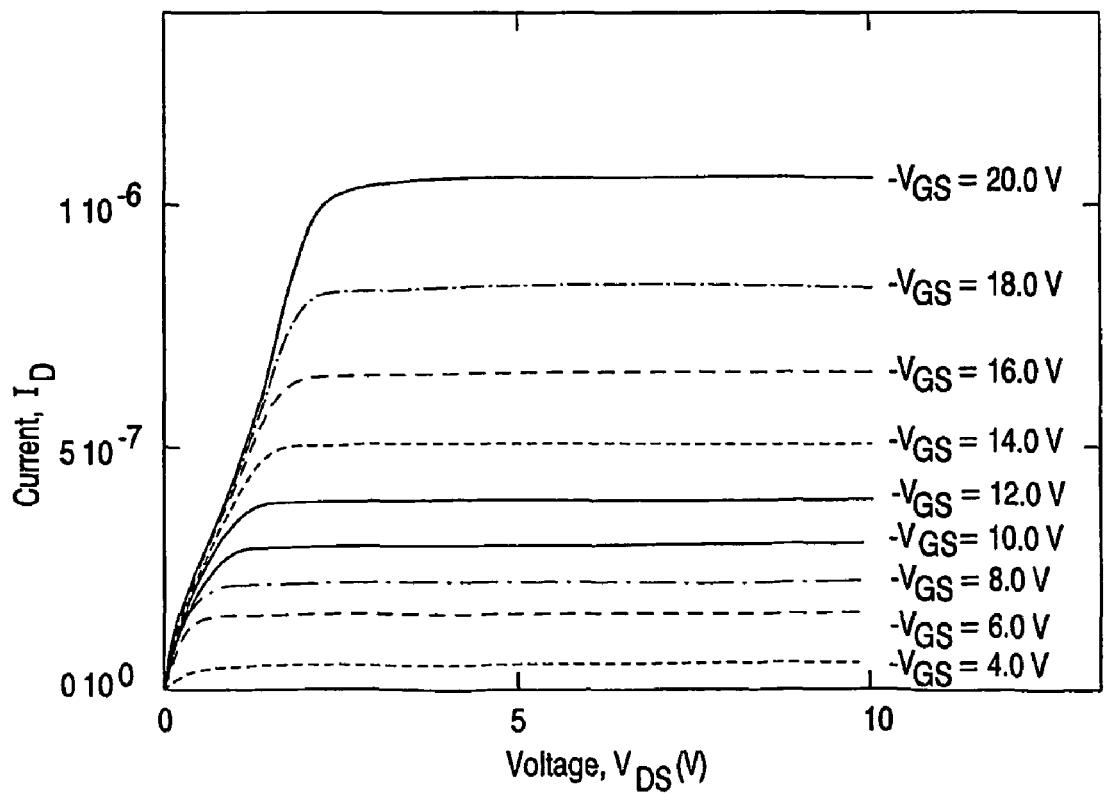
FIG. 7 shows the measured transistor characteristics for an SGT.
Figure 8:
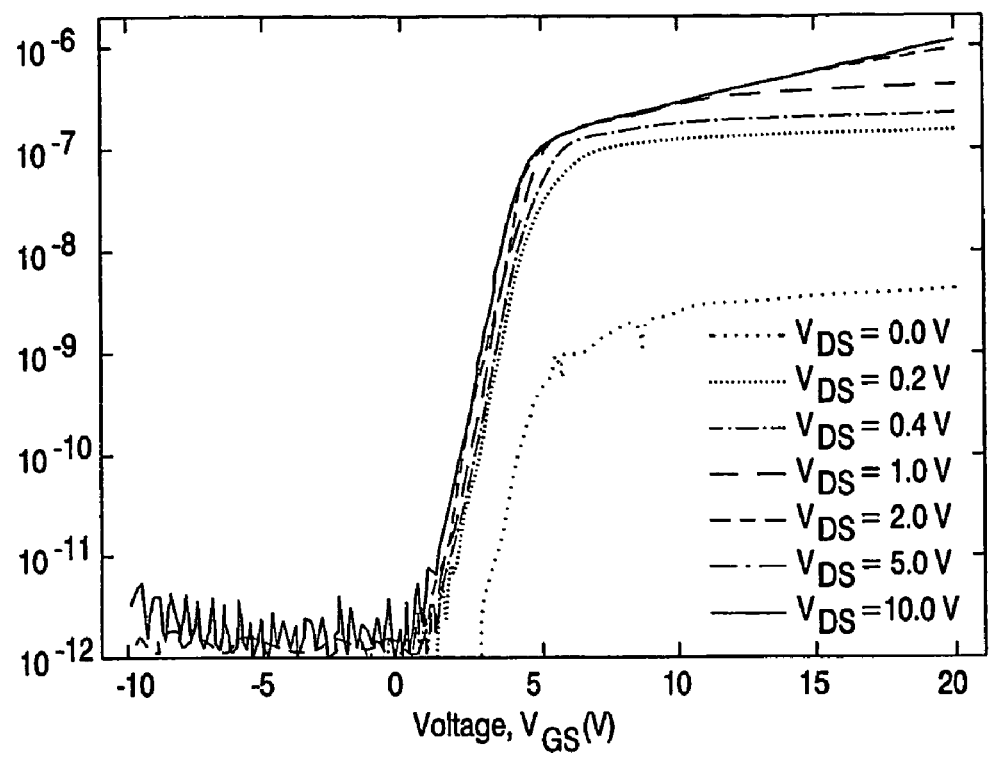
FIG. 8 shows the measured transfer characteristics for the SGT measured in FIG. 7.
Figure 9:
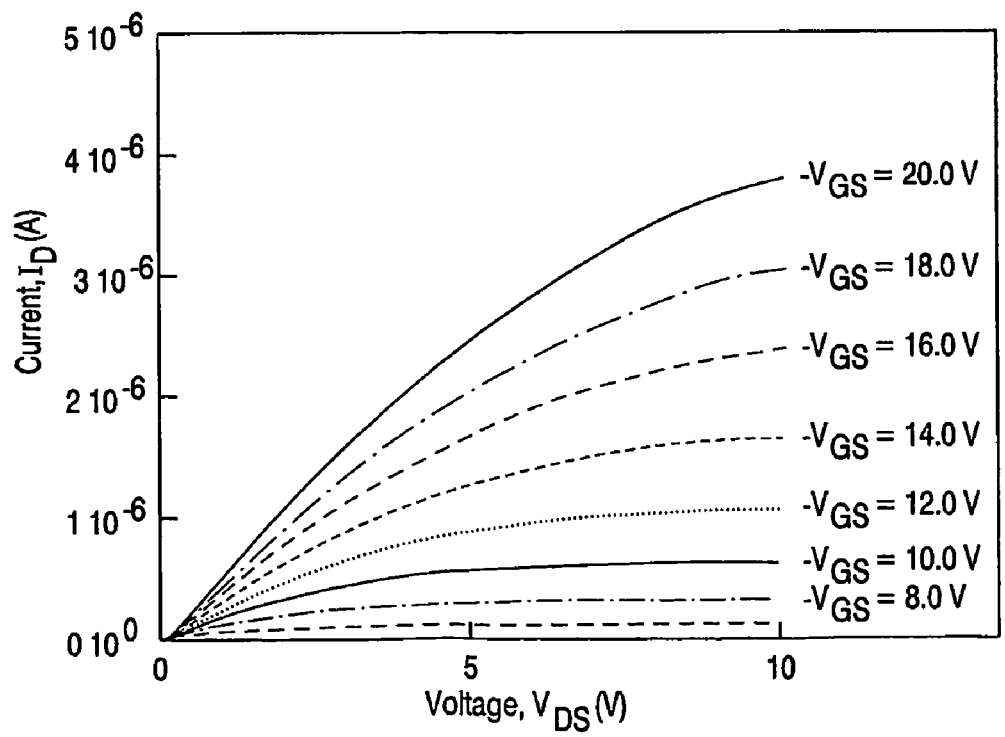
FIG. 9 shows the measured transistor characteristics for a comparative TFT.

The characteristics of a SGT with a 600 µm source width (perpendicular to the source-drain direction) were measured and are shown in FIGS. 7 and 8. The semiconductor body layer had a thickness of 100 nm, the gate was 300 nm thick SiN and the source doping was as in the example of FIGS. 1 to 3. The characteristics scaled with source width and were minimally affected by the source-drain separation down to 2 µm separation. This shows that the source barrier is well screened from the drain field. For comparison a TFT was made with the same deposited layers as the SGT, operating at a similar current level. The characteristics of this TFT are illustrated in FIG. 9.

It is seen that the pinch-off voltage is much greater for the TFT than for the SGT. For example, with 12 V on the gate the SGT could be operated as an amplifier down to a drain voltage of 2V while the TFT would need 8V.

Note that after pinch-off the current is largely independent of the drain-source voltage. Changes in the drain voltage have very little effect on the conduction, since such changes hardly effect the injection of carriers over the barrier. This gives rise to the very flat curves seen in FIG. 7, i.e. to a very high output impedance, of order $10^9$ Ω. The pinch off voltage may also be seen to be small, in the range 0.5V to 2.5V for the device tested. This is much lower than for the conventional TFT tested, as may be seen from FIG. 9.

The skilled person will appreciate that the invention is not limited to the structure described above, and some other structures in accordance with the invention will be described below.

In a second embodiment of the invention, shown in FIG. 10, a further bottom gated structure is shown with gate 4 on substrate 2. This structure differs from that of FIG. 1 in important respects. The drain region 36 is doped strongly n-type, so that the drain contact 24 makes an ohmic contact to the drain region instead of a Schottky contact as in the embodiment of FIG. 1. Further, a field insulator 42 is provided over part of the intermediate region 34 of the amorphous silicon body layer 10, and the metallisation 18 extends beyond the source electrode 22 over this field insulator 42 to form a field plate 44. The purpose of the field plate 44 is to provide field relief at the edge of the source using the drain so that the field at the periphery of the source: is insensitive to the voltage on the drain electrode 24.

It will be noted that in this embodiment the whole of the lateral extent of the gate 4 lies under the source electrode 22. Thus this arrangement has effectively no channel region whatsoever directly over the gate—the intermediate region 34 is laterally spaced from the gate. As will be appreciated, this is very different from a conventional TFT in which the effect of the gate on the channel provides the bulk of the current modulation.

A further bottom gated embodiment is shown in FIG. 11. In this embodiment, compensation doping 38 is used as in the embodiment of FIG. 3 instead of a field plate as in the embodiment of FIG. 10. Further, in this embodiment the gate 4 extends laterally beyond the Schottky source 22 under the intermediate region 34 with the compensated implant 38 in the semiconductor body 10. The uncompensated donor implant 6 lies under the source 22 and drain 24 electrodes in the source region 32 and drain region 36 where it controls the Schottky barrier height and the magnitude of the current. This embodiment can be made using a low number of masks.

Referring to FIG. 12, the invention is also applicable to a top gated structure. In the structure of FIG. 12, the source metal 22 is deposited directly on a glass substrate 2 followed by insulator 52. Insulator 52 is then patterned to have a source contact hole 50. An amorphous silicon layer 10 is then deposited over the substrate, making contact to the source metalisation 22 through the source contact hole 50. A thin silicon nitride layer 8 is then deposited and patterned, and a gate 4 is provided over the source contact hole 50. Further, the drain region 36 of the amorphous silicon layer 10 is doped highly n-type and an ohmic drain contact 54 is deposited in contact with the drain region.

It will be noted that in this device gate 4 does not extend over the intermediate region 34 between source region 32 and drain region 36.

In an alternative embodiment, illustrated in FIG. 13, the gate 4 extends laterally sideways over insulator 8, which in turn defines a wider source region 32. Further, in this embodiment the ohmic drain contact 54 of the FIG. 12 embodiment is replaced by a Schottky drain contact 24.

In both of the embodiments of FIGS. 12 and 13 part of the insulating layer 52 at the edge of the source contact hole 50 acts as a field insulator 42 to ensure that part of the source electrode 22 acts as a field plate 44 below the intermediate region 34 of the amorphous silicon layer 10 and thus making the source field less dependent on the voltage applied at the drain.

It will be noted that the arrangements of FIGS. 10 to 13 are essentially single sided in that there is a single drain electrode 24,54 arranged laterally of the source with a single intermediate region 34. In contrast the arrangement of FIG. 3 has a pair of Schottky drain electrodes 24 arranged one on either side of the Schottky source and gate, ensuring that there are two intermediate compensated regions 38. As illustrated in FIG. 14, such an arrangement is not limited to the bottom gated arrangement of FIG. 3.

FIG. 14 shows a top gated structure having a pair of ohmic drain contacts 54 arranged on either side a top gate 4 which is in turn arranged above gate insulator 8, semiconductor body layer 10 and source electrode 22 through contact hole 50 in insulator 52. This arrangement provides an excellent device because the ohmic drain contacts reduced as far as possible any on-resistance. Again, field relief at the edge of the source is provided by a field plate.

FIG. 15 shows an alternative implementation. In this arrangement, bottom source and drain Schottky contacts 22, 24 are arranged under insulating layer 52 defining source contact hole 50 and drain contact hole 56. These are followed by an amorphous silicon body layer 10, a silicon nitride gate insulation layer 8 and the gate contact 4. Field relief is provided by field plates 44 at source and drain. This approach is very easy to manufacture.

A yet further approach is illustrated in FIG. 16. In this approach, the gate is formed by a hydrogenated amorphous silicon layer 60 with a silicide layer 62 formed on the top. Gate insulator 8 and semiconductor body layer 10 are formed by deposition over the step of the layer. The vertical step configuration produces a short gap between source 22 and drain 24 which depends on the thickness of the layer 60.

The previous embodiments have been illustrated for the case of amorphous silicon as the semiconductor body. However, the invention is also beneficial using polysilicon as illustrated in FIG. 17. FIG. 17 shows a device formed on substrate 2. After gate electrode 4 and silicon dioxide gate insulating layer 8 are formed a polysilicon layer 70 is deposited. At the edge of the source, the polysilicon layer 70 is etched to have a step 71 so providing field relief at the edge of the source electrode. Schottky source electrode 22 and drain electrode 24 are provided as before with a shallow implant 6 used to control the height of the Schottky barriers.

In the above embodiments, electrons have been the dominant charge carrier. However, the device may also use holes as the principal charge carrier. As illustrated in FIG. 18, a bottom gate 4 is covered by gate insulator 8 and in turn by polysilicon layer 70. The polysilicon layer 70 has a p+ doped drain region 36 under ohmic drain electrode 54 and an n source region 32 separated by a narrow intermediate region 34 under a field plate 44 extension of the Schottky source electrode 22, the field plate 44 being separated from the intermediate region 34 by field insulator 42. A p-n junction 72 is accordingly provided in the polysilicon layer 70—the gate 4 underlies this p-n junction 72 to provide a path in this region and ensure that holes can cross the p-n junction when the transistor is switched on.

The material of the Schottky source electrode 22 is chosen to present a barrier for holes of between 0.25 and 0.75 times the band gap. For a high barrier, for p-type transistors, a different source electrode material is chosen, and magnesium, erbium or indium tin oxide may be used. Such materials may have a smaller work function than those used for n-type carrier transport.

Note that in this embodiment the source region 32 is still doped lightly doped n-type, although it could also be undoped or even lightly doped p-type.

FIG. 19 shows a complementary transistor pair implemented in polysilicon. An n-type source gated transistor 140 and an p-type source gated transistor 142 are formed on a common substrate 2. Gates 4 are formed on the substrate, followed by insulator layer 8 and semiconductor body layer 10. The semiconductor body layer is doped p-type in first source region 144 in the n-type SGT 140 and n-type in a second source region 146 to form the source region of the p-type SGT 142. Trench 148 separates the n-type and p-type SGTs 140,142. An n+ drain region 152 is implanted to form the drain of the n-type SGT 140 and a p+ drain region 154 is implanted to form the drain of the p-type SGT 142.

Each SGT 140,142 has a source contact 156,158 which forms a barrier at the respective source 144,146.

An implant 150 is implanted at the barrier of each transistor. Most metals make a high barrier to electrons and a low barrier to holes so the implant 150 is used to lower the source electrode barrier of the n-type SGT 140 and to raise the source electrode barrier of the p-type SGT 142.

In a preferred embodiment, both implants are the same—both require the implantation of donors. For example, a 10 keV implantation of phosphorous may be used.

This embodiment allows the straightforward manufacture of complementary SGTs on a single substrate, which may be required in some applications.

The barrier between the source and the semiconductor need not be a Schottky barrier, but a heterojunction barrier layer may also be used. FIG. 20 illustrates a device having a polysilicon layer 70 with an amorphous silicon layer 78 deposited on top. The source electrode 22 is a metal contact. Bottom gate 4 is separated from the polysilicon layer 70 by gate insulator 8 as before. Because amorphous silicon has a wider band gap than polysilicon, the amorphous silicon layer 78 forms a barrier between the metal source electrode 22 and the polysilicon layer 70 that functions in like manner to the Schottky barrier in the previously described embodiments. Note that field insulator 42 is provided at the edge of the source between the amorphous and polysilicon layers 70,78 to form field plate 44

A top gated heterojunction arrangement is illustrated in FIG. 21. In this case, a single amorphous silicon layer 80 is deposited on top of the source electrode 22. A laser is then used to crystallise the top part of the amorphous silicon layer 80, leaving a polysilicon layer 84 overlying an amorphous silicon layer 82. A drain electrode 24, silicon dioxide gate insulator 8 and gate 4 are then provided as before. As will be appreciated, the need to use only a single semiconductor layer makes manufacturing of this device much easier.

FIG. 22 illustrates a further arrangement, in which a top gate 4 on gate insulator 8 extends beyond the source electrode 22 and approaches the drain electrode 24. In this case, the drain contacts an n+ polysilicon layer 85 underlying the drain electrode 24. The remainder of the polysilicon body layer 70 is doped lightly p-type or undoped so that a p-n junction 72 forms between the drain region and the remainder of the polysilicon layer.

A similar arrangement is illustrated in FIG. 23, which shows a dual sided arrangement on a bottom gate 4 having a pair of drain electrodes 24 laterally spaced from and on either side of a source electrode 22. Field relief of the source regions is provided by a field plate 44 and field insulator 42. Note that in this case the n+ polysilicon layer 85 is provided under both of the drain electrodes leaving the remainder of the polysilicon layer 70 undoped.

The above embodiments use silicon thin films, but the skilled person will be aware of other thin film materials that may be useful. In particular, organic semiconductors (including polymer semiconductors) are of particular utility, since these can be deposited as thin films. Examples of suitable organic semiconductors include polyalkyl thiophenes, to which good Schottky barriers have been demonstrated.

The invention is not limited to thin-films and devices according to the invention may also be made on crystalline semiconductor substrates. FIG. 24 illustrates a monocrystalline p− substrate 90 having an n+ doped gate region 92. A silicon dioxide layer 94 and p doped silicon layer 96 are formed using a SIMOX process. This involves implanting oxygen ions at a depth in substrate 90 to form the oxide layer 94. A p+ implant 98 provides an ohmic contact for drain electrode 24. An oxide layer 100 lies across the p doped silicon layer 96, and defines a source contact hole 50 through which Schottky source electrode 22 contacts p doped silicon layer 96. The Schottky source electrode 22 overlies a region of the semiconductor body 96 which contains a shallow implant 6 to control the Schottky barrier height.

FIG. 25 shows a further embodiment, in which a silicide source 110 is defined on the top of substrate 90. Source insulator 52 defining source contact hole 50 is then deposited, followed by an undoped silicon layer 112 formed using Solid phase epitaxy. An n+ implant 114 provides an ohmic contact with drain electrode 24, and a junction with semiconductor body region. Gate insulator 8 is arranged over the silicon layer 112, and a gate 4 is provided on top of that. It will be noted that the n+ implants forming drain contacts 114 can be autoaligned using the gate insulator and gate.

Some further embodiments will now be described which exploit some of the advantages of a source gated transistor.

FIG. 26 illustrates an embodiment in which the source barrier is implemented as a bulk unipolar diode. The substrate 2, gate 4, gate insulator 8 and semiconductor body layer 10 are implemented as in the embodiment of FIGS. 1 to 3. A unipolar diode structure 120 is arranged above the gate 4 to form the source. The unipolar diode structure 120 includes a double diffused implant having a p+ acceptor implant 122 under an n++ donor implant 124, the latter here forming part of the source. Source contact 126 contacts the n++ donor implant 124 and is insulated from the body 10 by insulator 128. Drain contact 24 is laterally spaced from the source unipolar diode structure 120.

A further embodiment is shown in FIG. 27, formed on substrate 2 with gate electrode 4 and insulator 8 over the gate electrode. In this arrangement, the body layer 10 has lateral regions: specifically a source body region 32 doped n− connected to the source electrode 22, an n+ doped drain region 36 in contact with the drain electrode 24, and the rest of the body layer 10 being doped p type, thus forming intermediate region 34. In this way, a p-n junction is provided to the drain which blocks current when the gate is off. This means that the off-current can be very low even with a low source barrier. This structure is thus particularly suitable for a high-current device, for which a low barrier is likely to be required.

FIG. 28 illustrates a further embodiment in single-crystal silicon, in a device having opposed first and second major surfaces. A drain contact on the second (rear) major surface connects to an n+ or p− layer 2, and a bulk layer 134. Buried gates 4 having insulator 8 are provided at the upper (first) surface of the bulk layer: an n− body layer 10 is formed above this layer. A plurality of Schottky source contacts 22 are formed over the first major surface, in holes in insulating layer 132 that defines field plates 42 at the edges of the source contacts 22. The source contacts 22 are laterally aligned over the buried gates 4. The gates are arranged to influence the flow of electrons over the Schottky barrier between the source contact 22 and the body 10 and so control the current flow in the device.

As will be seen, in this case the drain electrode is connected not directly to a drain region of the semiconductor body but through bulk layer 134 to the semiconductor body 10.

This arrangement can act as a power semiconductor device. In the on-state the power dissipated by the device can be much smaller than a FET such as a DMOS because it can be operated with a lower drain voltage.

From reading the present disclosure, other variations and modifications will be apparent to persons skilled in the art. Such variations and modifications may involve equivalent and other features which are already known in the design, manufacture and use of transistors and which may be used in addition to or instead of features described herein.

The invention claimed is:

1. An insulated gate transistor for conduction using charge carriers of a predetermined conductivity type, comprising:
   a semiconductor body layer;
   a source electrode laterally extending across a source region along one major side of the semiconductor body layer defining a Schottky potential barrier between the source electrode and the source region of the semiconductor body layer,
   a drain electrode connected to the semiconductor body layer, the drain electrode laterally spaced from the source electrode along the one major side of the semiconductor body; and
   a gate electrode for controlling transport of carriers of the predetermined carrier type from the source electrode to the source region of the semiconductor body layer across the barrier when the source region is depleted;
   wherein the gate electrode and the source electrode are arranged in a wholly opposed laterally overlapping relationship to each other;
   wherein the gate electrode is located on an opposite side of the semiconductor body layer to the source electrode having a gate insulator layer between the gate electrode and the semiconductor body layer; and
   wherein the gate electrode is spaced from the source electrode by at least the combined full thickness of the semiconductor body layer and the gate insulator over the whole of the gate-controlled region of the Schottky barrier.

2. A transistor according to claim 1 including dopant impurities in the semiconductor body layer under the source electrode for controlling the effective barrier height.

3. A transistor according to claim 2 wherein the dopant is a shallow implant of donor impurities to raise the effective barrier height to holes and to lower the effective barrier height to electrons.

4. A transistor according to claim 1 further comprising a field relief structure at the lateral edge of the source electrode facing the drain electrode.

5. A transistor according to claim 4 wherein the drain electrode is connected to a drain region of the semiconductor body layer, the drain region being spaced from the source region by an intermediate region of the semiconductor body layer, and the field relief structure is the intermediate region of the semiconductor body layer between the source region and the drain region, the intermediate region being compensated.

6. A transistor according to claim 4 wherein the drain electrode is connected to a drain region of the semiconductor body layer, the drain region being spaced from the source region by an intermediate region of the semiconductor body layer, and the field relief structure comprises an extension to the source electrode extending laterally across at least part of the intermediate region, separated from the said part of the intermediate region by a field relief insulating layer.

7. A transistor according to claim 1 wherein the drain electrode is connected to a drain region of the semiconductor body layer, the drain region being spaced from the source region by an intermediate region of the semiconductor body layer, and the lateral extent of the intermediate region between the drain region and the source region is less than 5 micrometer.

8. A transistor according to claim 1 wherein the lateral extent of the gate electrode towards the drain is overlapped wholly by the source electrode.

9. A transistor according to claim 1 comprising a pair of drain electrodes and corresponding drain regions of the semiconductor body layer laterally on either side of the source region.

10. A transistor according to claim 1 wherein the potential barrier has a barrier potential for the predetermined charge carrier type of between 0.25 times and 0.75 times the band gap of the semiconductor of the semiconductor body layer.

11. A transistor according claim 1 wherein the semiconductor body layer is a thin film of deposited semiconductor material.

12. A transistor according to claim 1 wherein the semiconductor body layer is of amorphous silicon.

13. A transistor according to claim 1 wherein the semiconductor body layer is of polysilicon.

14. A transistor according to claim 1 wherein the semiconductor body layer is of organic semiconductor.

15. A method of using the transistor according to claim 1, including applying a voltage between the source, gate and drain electrode to substantially deplete the whole of the source region of the semiconductor body layer in the region of the gate electrode and to cause carriers of the predetermined conductivity type to be emitted by the source electrode across the barrier and across the depleted source region to the drain region and then to the drain electrode.

16. A method of using the transistor according to claim 15 including further varying the source-gate voltage to vary the source-drain current.

17. A transistor arrangement, comprising a substrate; and a plurality of transistors according to claim 1 distributed over the substrate.

18. A transistor arrangement according to claim 17 including both n-type and p-type transistors.

19. A transistor arrangement according to claim 18 wherein there is a shallow implant of donor impurities under the barriers of p-type and n-type transistors to raise the effective barrier height to holes in the p-type transistors and to lower the effective barrier height to electrons in the n-type transistors.

20. The insulated gate transistor according to claim 1, wherein the drain electrode includes a pair of drain electrodes; and
   wherein the source electrode is centrally located along the one major side of the semiconductor body between the pair of drain electrodes.

21. An insulated gate transistor for conduction using the charge carriers of a predetermined conductivity type, comprising:
   a semiconductor body layer having a thickness of at least 10 nm;

a source electrode laterally extending across a source region along one major side of the semiconductor body layer defining a potential barrier between the source electrode and a source region of the semiconductor body layer, a drain electrode connected to the semiconductor body layer, the drain electrode laterally spaced from the source electrode along the one major side of the semiconductor body; and a gate electrode for controlling transport of carriers of the predetermined carrier type from the source electrode to the source region of the semiconductor body layer across the barrier when the source region is depleted;

wherein the gate electrode and the source electrode are arranged in a wholly opposed laterally overlapping relationship to each other;

wherein the gate electrode is located on an opposite side of the semiconductor body layer to the source electrode having a gate insulator layer between the gate electrode and the semiconductor body layer; and wherein the gate electrode is spaced from the source electrode by at least the combined thickness of the full thickness of the semiconductor body layer and the gate insulator over the whole of the gate-controlled region of the source barrier.

22. A transistor according to claim 21 further comprising a heterojunction layer between the source electrode and the semiconductor body layer forming the barrier.

23. An insulated gate transistor for conduction using charge carriers of a predetermined conductivity type, comprising:

a semiconductor body layer;

a laterally-extending source electrode defining a lateral barrier at one major side of the semiconductor body layer;

a drain electrode laterally spaced from the source electrode along the one major side of the semiconductor body layer by an intermediate region of the semiconductor body layer; and a gate electrode extending laterally on an opposite major side of the semiconductor body layer to the source electrode to define a gate-controlled region of the semiconductor body layer extending across the semiconductor body layer to a source barrier;

a gate insulator layer between the gate electrode and the semiconductor body layer; and a field relief structure on the edge of the source region facing the drain region, wherein the gate electrode and the source electrode are arranged in a wholly opposed laterally overlapping relationship to each other.

24. The insulated gate transistor according to claim 23, wherein the drain electrode includes a first drain electrode laterally spaced from the source electrode along the one major side of the semiconductor body layer by a first intermediate region of the semiconductor body layer, and a second drain electrode laterally spaced from the source electrode along the one major side of the semiconductor body layer by a second intermediate region of the semiconductor body layer, and wherein the source electrode is centrally located along the one major side of the semiconductor body between the first drain electrode and the second drain electrode.

25. An insulated-gate transistor for conduction using charge carriers of a predetermined conductivity type, comprising:

a semiconductor layer that provides a body portion of the transistor between a source of the said carriers and a drain for the said carriers, wherein the drain is laterally spaced from the source along one major side of the semiconductor layer; and an insulated gate including a gate electrode coupled to the body portion via an intermediate gate-dielectric layer;

wherein the source comprises a barrier to the said carriers between a source electrode and the semiconductor layer so as to inhibit carrier flow from the source into the body portion except as controlled by the insulated gate;

wherein the insulated gate is located at a major side of the semiconductor layer which is opposite the one major side, wherein the source and the insulated gate are located in a wholly opposed laterally-overlapping relationship which separates the source from the insulated gate by at least an intermediate thickness of the semiconductor layer;

and the insulated gate is coupled to the source barrier via the intermediate thickness of the semiconductor layer so as to permit transistor conduction by controlled emission of said carriers across the source barrier by voltage applied between the gate and source electrodes upon depletion of the body portion across the intermediate thickness of the semiconductor layer from the insulated gate.

26. A transistor comprising a source electrode on one side of a semiconductor body layer and a gate electrode in a wholly opposed laterally-overlapping relationship to the source electrode on an opposite side of a semiconductor body layer;

and a drain electrode connected to the semiconductor body layer and laterally spaced from the source electrode along a major side of the semiconductor body, wherein the source electrode has a potential barrier to the semiconductor body layer, and source-drain current is controlled by the gate voltage upon depletion of a region of the semiconductor body layer adjacent to the source barrier by the application of suitable source-drain voltage and gate voltage.

27. A transistor circuit, including an insulated gate field effect transistor having a semiconductor body layer, a source electrode and a gate electrode arranged in a wholly opposed laterally overlapping relationship on opposite sides of the semiconductor body layer, with a barrier between the source electrode and the semiconductor body layer and a gate insulator between the semiconductor body layer and the gate, and a drain electrode connected to the semiconductor body layer and laterally spaced from the source electrode along a major side of the semiconductor body; and a circuit arranged to apply voltages to source, gate and drain electrodes to deplete the semiconductor body layer in the region of the source electrode and to control the barrier height of the barrier by the source-gate voltage to control the emission of carriers from the source electrode to the semiconductor body layer and hence to control the source-drain current by the source-gate voltage.

* * * * *